United States Patent
Kim et al.

(10) Patent No.: US 8,187,498 B2
(45) Date of Patent: May 29, 2012

(54) PHOSPHOR, METHOD FOR MANUFACTURING THE SAME, AND LIGHT EMITTING DIODE

(75) Inventors: Kyung Nam Kim, Seoul (KR); Tomizo Matsuoka, Seoul (KR); Mi Youn Chang, Yongin-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 12/883,599

(22) Filed: Sep. 16, 2010

(65) Prior Publication Data

US 2011/0001091 A1    Jan. 6, 2011

Related U.S. Application Data

(62) Division of application No. 11/770,482, filed on Jun. 28, 2007, now Pat. No. 7,820,074.

(30) Foreign Application Priority Data

Jun. 28, 2006 (KR) .................. 10-2006-0058831
Jun. 30, 2006 (KR) .................. 10-2006-0060972

(51) Int. Cl.
*C09K 11/68* (2006.01)

(52) U.S. Cl. .... 252/301.4 R; 252/301.4 H; 252/301.4 P; 423/299; 423/305

(58) Field of Classification Search .................. 423/299, 423/305; 252/301.4 F, 301.4 H, 301.4 P, 252/301.4 R See application file for complete search history.

(56) References Cited

U.S. PATENT DOCUMENTS

| | | | |
|---|---|---|---|
| 3,673,450 A | 6/1972 | Leach | |
| 4,473,634 A | 9/1984 | Dodds et al. | |
| 4,990,416 A | 2/1991 | Mooney | |
| 5,441,774 A | 8/1995 | Dutta et al. | |
| 5,639,399 A | 6/1997 | Iwase et al. | |
| 6,967,116 B2 | 11/2005 | Negley | |
| 7,005,085 B2 | 2/2006 | Hampden-Smith et al. | |
| 7,297,293 B2 * | 11/2007 | Tamaki et al. | 252/301.4 F |
| 7,396,489 B2 * | 7/2008 | Horikawa et al. | 252/301.4 F |
| 2006/0210791 A1 | 9/2006 | Yoo et al. | |

FOREIGN PATENT DOCUMENTS

JP    57-108186    7/1982

(Continued)

OTHER PUBLICATIONS

Non-Final Office Action of U.S. Appl. No. 11/770,482 issued on Mar. 11, 2009.

(Continued)

*Primary Examiner* — Stuart Hendrickson
*Assistant Examiner* — Richard M Rump
(74) *Attorney, Agent, or Firm* — H.C. Park & Associates, PLC

(57) ABSTRACT

A phosphor is formed with a glass coating layer on a surface of a phosphor grain to have improved moisture and/or thermal stability. A method for manufacturing the phosphor comprises preparing phosphor gains excitable by light, and forming a glass coating layer on a surface of each phosphor grain. The glass coating layer may be formed by mixing the phosphor grains with a glass composition; heat-treating a mixture of the phosphor grains and the glass composition to make the glass composition melt and surround the phosphor grains; and cooling and breaking the heat-treated mixture to provide phosphors, each comprising the phosphor grain having the glass coating layer formed on a surface of the phosphor grain.

9 Claims, 6 Drawing Sheets

FOREIGN PATENT DOCUMENTS

| | | | | |
|---|---|---|---|---|
| JP | 58080375 A | * | 5/1983 | |
| JP | 09-263753 | | 10/1997 | |
| JP | 09263753 A | * | 10/1997 | |
| JP | 11-256151 | | 9/1999 | |
| JP | 2002-173675 | | 6/2002 | |
| JP | 2002-223008 | | 8/2002 | |
| JP | 2006-052345 | | 2/2006 | |
| JP | 2006-052345 A | * | 2/2006 | |
| WO | WO 2005059944 A1 | * | 6/2005 | |

OTHER PUBLICATIONS

Final Office Action of U.S. Appl. No. 11/770,482 issued on Jul. 20, 2009.

Non-Final Office Action of U.S. Appl. No. 11/770,482 issued on Jan. 15, 2010.

Notice of Allowance of U.S. Appl. No. 11/770,482 issued on Jun. 23, 2010.

"Continuous production of phosphor YAG:Tb nanoparticles by hydrothermal synthesis in supercritical water" issued in Materials Research Bulletin 38 (2003) p. 1257-1265 by Yukiya Hakuta, Tsukasa Haganuma, Kiwamu Sue, Tadafumi Adschiri, and Kunio Arai.

U.S. Non-Final Office Action dated Nov. 18, 2011 (from co-pending U.S. Appl. No. 12/883,712).

Final Office Action issued on Mar. 29, 2012 in U.S. Appl. No. 12/883,712.

* cited by examiner

PHOSPHOR, METHOD FOR MANUFACTURING THE SAME, AND LIGHT EMITTING DIODE

CROSS-REFERENCE TO RELATED APPLICATIONS

This application is a divisional of U.S. application Ser. No. 11/770,482 filed on Jun. 28, 2007 and claims priority from and the benefit of Korean Patent Applications Nos. 10-2006-0058831, filed Jun. 28, 2006, and 10-2006-0060972, filed Jun. 30, 2006, which are hereby incorporated by reference for all purposes as if fully set forth herein.

BACKGROUND OF THE INVENTION

1. Field of the Invention

The present invention relates to a phosphor, a method for manufacturing the same, and a light emitting diode. More particularly, the present invention relates to a phosphor having moisture and/or heat stability, a method for manufacturing the same, and a light emitting diode using the phosphor.

2. Description of the Related Art

Phosphors known in the art include oxide-based phosphors, sulfide-based phosphors, recently developed nitride-based phosphors, and the like. The phosphors are typically excited by light from a blue or UV light emitting diode chip, and require moisture or heat stability to maintain good light emitting characteristics of a light emitting diode.

Currently, blue light emitting diode chips have been gradually increased in size to achieve application of white light emitting diodes to common illumination. With this trend in the art, when driven under rated current without a specific device for heat dissipation, the light emitting diode chip undergoes high heat of approximately 120° C. or more, which is generated in a brief instance from a light emitting layer of the chip and causes significant reduction in luminous intensity of the phosphor. Generally, when the temperature increases around the phosphor, the phosphor has a widened spectrum resulting from interference between a host lattice and activators and lattice expansion caused by lattice vibration, and experiences reduction in the luminous intensity due to variation of chromaticity coordinate and weakening of a crystal field. Additionally, the oxide-based phosphors such as YAG:Ce and $(Ba, Sr, Ca)_2SiO_4$:Eu arc likely to be affected by an increase in temperature of the light emitting diode chip and thus undergo a rapid deterioration of fluorescent characteristics. It is believed that the deterioration of the fluorescent characteristics caused by the temperature increase is affected by the bonding strength of compounds and a size difference between the activators and the host lattice. Particularly, since conventional white light emitting diode-based products such as automotive head light, indirect illumination, etc. have operating temperatures up to 150° C., there is a need of developing phosphors and light emitting diodes that experience little variation in optical characteristics such as light intensity and chromaticity coordinate, and exhibit a superior stability even at high temperatures.

As mentioned above, the light emitting diode can realize white light using such phosphors that function as frequency converting means. Specifically, with the phosphors disposed above the light emitting diode chip, the light emitting diode obtains the white light through color mixing of some parts of primary light emitted from the light emitting diode chip and secondary light, of which frequency is converted by the phosphors. Since such a white light emitting diode is cheap and operated by very simple principles and configurations, it is widely employed in the art.

For instance, for a white light emitting diode wherein phosphors for emitting yellow-green or yellow light based on blue light emitted from a blue light emitting diode chip as an excitation source are applied to the surface of the blue light emitting diode chip, it is possible to obtain white light through combination of the blue light emitted from the light emitting diode chip and the yellow-green or yellow light from the phosphors. However, such a white light emitting diode exhibits low color rendering due to lack of a spectrum in green and red regions relating to the phosphors emitting single yellow light, and, in particular, the white light emitting diode is difficult to realize natural or similar colors due to a low color purity after transmission of light through a color filter, when employed as a light source of an LCD backlight unit.

In order to solve the problems as described above, another conventional white light emitting diode includes a blue light emitting diode chip and phosphors capable of being excited by blue light emitted from the blue light emitting diode chip and emitting green light and red light. With this configuration, it is possible to realize white light having a high color rendering of 85 or more by mixing the green light and the red light emitted from the phosphor excited by the blue light. Since the white light emitting diode has a very high conformity to a color filter, a component of LCD, when employed as the light source of the LCD backlight unit, it has a merit in that the white light emitting diode can realize images closer to natural colors with its high color purity after transmission of light through the color filter.

Representative examples of the green light emitting phosphors include an orthosilicate phosphors and a thiogallate phosphor, both of which exhibit excellent blue light-based excitation efficiency. Here, the thiogallate phosphor is a sulfide-based phosphor expressed by $(Ca, Sr, Ba)(Al, Ga, In)_2S_4$:Eu, and has little influence on adjacent spectrums due to its very narrow full width at half maximum of 50~60 nm in a light emitting spectrum as well as the blue light—based excitation excellent efficiency, realizing very high color reproducibility when applied to the light source of the LCD backlight unit. However, the thiogallate phosphor has a problem in that it is likely to react with moisture, causing variation in chemical characteristics of the phosphor.

Further, representative examples of the red light emitting phosphors include 20 sulfide-based phosphors, such as (Ca, Sr)S:Eu, (Zn, Cd)(S, Se):Ag, etc., and nitride-based phosphors, such as $(Ca, Sr, Ba)_2Si_5N_8$:Eu, $CaAISiN_3$:Eu, Ce(Ca, Sr, Ba)$Si_7N_{10}$:Eu, $CaSiN_2$:Eu, etc., which have been recently developed. For the nitride-based phosphors, although it is possible to achieve an excellent chemical stability, the hill width at half maximum of the light emitting spectrum exists in a very wide range of 90~110 nm and overlaps with an adjacent green light spectrum, providing a relatively low color purity after transmission of light through the color filter when the nitride-based phosphors are employed as the light source of the LCD backlight unit.

Further, since the sulfide-based phosphors enable adjustment of a frequency in the range of 600~660 nm depending on a composition thereof and has a very narrow hill width at half maximum of 60~70 nm in the light emitting spectrum, they can realize higher color reproducibility when employed as the light source of the LCD backlight unit. However, the sulfide-based phosphors have problems in that they are likely to react with moisture, carbon dioxide, etc. in atmosphere and become oxides or carbonate, causing variation of the chemical characteristics of the phosphors. In addition, $H_2S$ gas generated by a chemical reaction between the sulfide-based phosphors and the moisture changes the fluorescent characteristics of the phosphors to cause a rapid reduction of luminous intensity along with variation of the chromaticity coordinate. Furthermore, the H$_2$S gas corrodes electrodes formed of metal such as Ag or Au, deteriorating reliability of the light emitting diode.

Particularly, the sulfide-based phosphors, such as (Ca, Sr)S:Eu, SrGa$_2$S$_4$:Eu, ZnS:Cu, Al, or (Zn, Cd)(S, Se):Ag. are likely to react with the moisture and lose their inherent fluorescent characteristics, causing a significant reduction of the luminous intensity and variation of the optical characteristics. As a result, the oxide-based phosphors and the sulfide-based phosphors are limited in their applications.

SUMMARY

The present invention is conceived to solve the problems of the conventional techniques as described above, and an object of the present invention is to provide a phosphor that has a glass coating layer formed on a surface of a phosphor grain to have improved moisture and/or thermal stability, and a method of manufacturing the same.

It is another object of the present invention to provide a light emitting diode that comprises the phosphor having the improved moisture stability to have enhanced reliability through improvement in stability in terms of color temperature, chromaticity coordinate, etc. with excellent light emitting characteristics.

In accordance with one aspect of the present invention, the above and other objects can be accomplished by the provision of a phosphor, comprising: a. phosphor grain excitable by light, wherein the phosphor grain has a glass coating layer formed on a surface thereof.

According to one embodiment of the present invention, the glass coating layer comprises a glass composition expressed by the following formula:

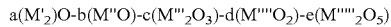

where M' is one element selected from the group consisting of Li, Na and K, M" is at least one element selected from the group consisting of Mg, Ca, Sr, Ba, Cu, Zn, Pb and Be, M''' is at least one element selected from the group consisting of B, Al, Ga, In, Fe, Y, La, Sc and Bi, M'''' is at least one element selected from the group consisting of Si, Ti and Ge, M''''' is at least one element selected from the group consisting of P, Ta and V, and a, b. c, d and e are set in the ranges of $0 \leq a \leq 0.6$, $0 \leq b \leq 0.6$, $0 \leq c \leq 0.6$, $0 \leq d < 0.95$, and $0 \leq e \leq 0.2$.

According to another embodiment of the present invention, the glass coating layer may comprise SiO$_2$—Al$_2$O$_3$.

In accordance with another aspect of the present invention, a method for manufacturing a phosphor comprises: preparing phosphor grains excitable by light; and forming a glass coating layer on a surface of each phosphor grain.

According to one embodiment of the present invention, the glass coating layer forming step comprises: mixing the phosphor grains with a glass composition; heat-treating a mixture of the phosphor grains and the glass composition to make the glass composition melt and surround the phosphor grains; and cooling and breaking the heat-treated mixture to provide phosphors, each comprising the phosphor grain having the glass coating layer formed on a surface of the phosphor grain. Preferably, the heat-treating step is performed at a temperature in the range of about 500~1,500° C. The method further comprises performing heat treatment for surface treatment of the glass coating layer after the cooling and breaking step.

According to another embodiment of the present invention, the glass coating layer forming step, comprises: preparing a. mixture of a precursor for the glass coating layer, water and a solvent; and coating a glass on the surface of the phosphor grains through a sol-gel reaction obtained by mixing the phosphor grains with the mixture of the precursor, water and solvent. Preferably, the method further comprises filtering the glass-coated phosphor grains to separate phosphors, each comprising the phosphor grain having the glass coating layer formed thereon after the glass coating step. More preferably, the method further comprises drying and heat-treating the filtered phosphors having the glass coating layer. Preferably, the glass coating layer is SiO$_2$—Al$_2$O$_3$.

Preferably, the precursor of the glass coating layer comprises tetraethyl orthosilicate (TEOS) or tetramethyl orthosilicate (TMOS) as a precursor of SiO$_2$, and aluminum acetylacetonate (Al—AcAc), aluminum tri-sec-butoxide (Al-tsBO) or aluminum iso-propoxide (Al-iPO) as a precursor of Al$_2$O$_3$. The glass coating step is performed at a temperature within ±20° C. from an evaporation temperature ° C. of the solvent. The heat-treating step is performed at a temperature in the range of about 200~600° C.

In accordance with yet another embodiment of the present invention, a light emitting diode comprises: a light emitting diode chip; and a phosphor excitable by light emitted from the light emitting diode chip, wherein the phosphor comprises a phosphor grain having a glass coating layer formed on a surface thereof.

BRIEF DESCRIPTION OF THE DRAWINGS

The above and other objects, features and advantages of the present invention will become apparent from the following description of exemplary embodiments given in conjunction with the accompanying drawings, in which.

DETAILED DESCRIPTION

Figure 1:
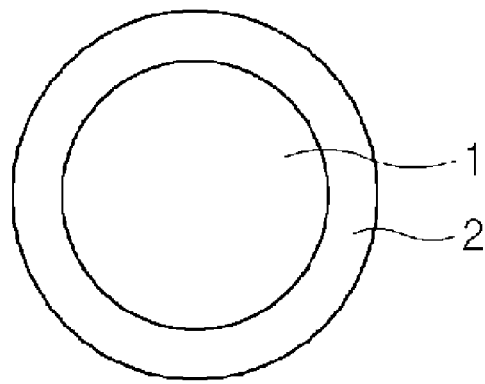
FIG. 1 is a cross-sectional view of a phosphor according to the present invention.

Exemplary embodiments of the present invention are described in detail with reference to the accompanying drawings hereinafter. The following embodiments are to be interpreted merely as an illustrative basis in the interest of teaching one skilled in the art to help sufficiently understand the spirit of the invention. Therefore, it is to be understood that the present invention is not limited to the embodiments disclosed herein and can be embodied in various different forms. Like elements are denoted by like reference numerals throughout the drawings. Herein, the words "a," "an," and "the" are used interchangeably with "at least one" to mean one or more of the elements being described.

A phosphor comprises a host lattice and activators, which are located at a suitable location in the host lattice and serve to determine a luminescence color through determination of an energy level associated with a luminescence process. Here, the luminescence color is determined based on an energy gap between a ground state and an excited state of the activators in the lattice structure. In other words, a major luminescence color of the phosphor comprising the activators is ultimately determined depending on an electronic state of the activators, that is, the energy level thereof. For example, since it is easiest for $Tb^{+3}$ ions to make a transition from 5d to 7f in the host lattice, they make green-yellow luminescence.

There is a variety of kinds of phosphors capable of making luminescence based on the energy difference as described above, and a light emitting diode having various luminescence colors, in particular, a white light emitting diode, can be manufactured using such phosphors.

However, the conventional phosphor has a problem in that it is likely to be degraded due to reaction with moisture and heat discharged from a light emitting diode chip.

Therefore, the present invention provides a phosphor that has an excellent stability against moisture and heat by coating a glass on a surface of a phosphor grain in manufacture of the phosphor.

FIG. 1 is a cross-sectional view of the phosphor according to the present invention. Referring to FIG. 1, the phosphor of the invention comprises a phosphor grain 1 and a glass coating layer 2 formed on the surface of the phosphor grain 1 to surround the phosphor grain 1. With this configuration, the phosphor can minimize variation caused by surrounding conditions by means of the glass coating layer 2 on the surface of the phosphor grain 1 while maintaining inherent luminous characteristics of the phosphor. That is, the glass coating layer 2 of the phosphor can completely block infiltration of moisture into the phosphor grain 1 to prevent deterioration (or degradation) of chemical characteristics caused by an unwanted reaction between the phosphor grain 1 and the moisture, and enables the phosphor to exhibit an excellent thermal insulation effect and an excellent stability at high temperatures based on a low thermal conductivity of a glass constituting the glass coating layer 2.

Next, a first embodiment of the invention is described with reference to FIGS. 1 to 3.

Embodiment 1

In this embodiment, a phosphor grain 1 comprises various kinds of phosphor. For example, the phosphor grain 1 may comprises an oxide-based phosphor such as YAG:Ce, $(Ba, Sr, Ca)_2SiO_4$:EU, etc., or a sulfide-based phosphor such as $(Ca, Sr)S$:Eu, $SrGa_2S_4$:Eu, ZnS:Cu, Al or (Zn, Cd)S:Ag or Cl, etc.

The glass coating layer 2 has a composition expressed by the following Formula 1: $a(M'_2O)$-$b(M''O)$-$c(M'''_2O_3)$-$d(M''''O_2)$-$e(M'''''_2O_5)$ Here, M' is one element selected from the group consisting of Li, Na and K, M" is at least one element selected from the group consisting of Mg, Ca, Sr, Ba., Cu, Zn, Pb and Be, M''' is at least one element selected from the group consisting of B, Al, Ga, In, Fe, Y, La, Sc and Bi, M'''' is at least one element selected from the group consisting of Si, Ti and Ge, and M''''' is at least one element selected from the group consisting of P, Ta and V. Further, a, b, c, d and e are set in the ranges of $0 \leq a \leq 0.6$, $0 \leq b \leq 0.6$, $0 \leq c \leq 0.6$, $0 \leq d \leq 0.95$, and $0 \leq e \leq 0.2$.

It should be noted that the glass coating layer 2 is not limited to this composition, and may comprise any of compositions which can form a glass through heat treatment. Further, the phosphor may be produced by coating a glass on the surface of a single phosphor grain or by coating the glass on the surfaces of plural phosphor grains.

Next, a method for manufacturing the phosphor according to this embodiment is described.

Figure 2:
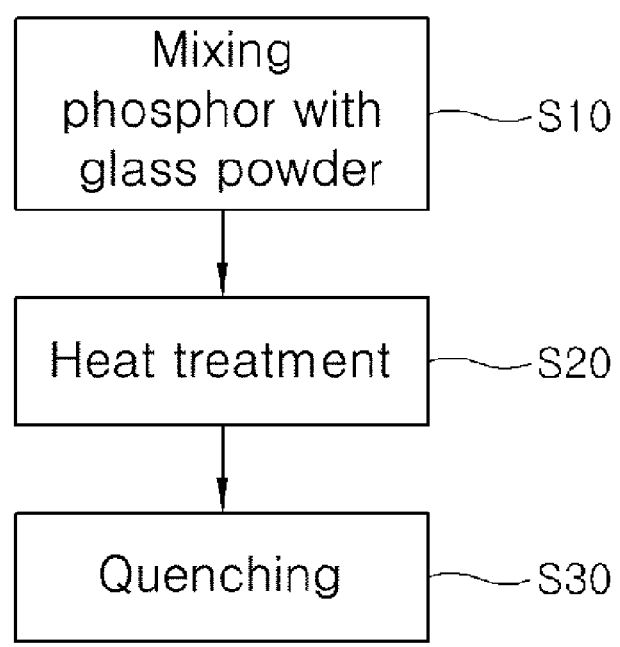
FIG. 2 is a flow chart illustrating a method for manufacturing a phosphor according to a first embodiment of the present invention.

FIG. 2 is a flow chart of the method for manufacturing the phosphor according to the present invention.

Referring to FIG. 2, the method comprises mixing phosphor grains and glass powders (S10), heat-treating a mixture of the phosphor grains and the glass powders such that the glass powders are melted and surround the phosphor grains (S20), and cooling, more preferably, quenching, and grinding the heat-treated mixture (S30).

First, the phosphor grains and the glass powders, that is, a glass composition, are mixed in a suitable ratio. Although the mixing ratio of the phosphor grains and the glass composition can be changed depending on a kind of phosphor grains, a kind of glass composition, a desired coating thickness, etc., it is desirable that the mixing ratio be 98:2~50:50 by weight.

In mixing of the phosphor grains and the glass composition, it is desirable that the phosphor grains and the glass composition be uniformly mixed to allow the glass composition to sufficiently surround each of the phosphor grains by the subsequent heat treatment.

Then, the uniform mixture is loaded in a platinum crucible and subjected to heat treatment at temperatures of about 500~1,500° C. At this time, the heat treatment is performed for a sufficient time, for example, about 1 hour, such that the glass composition of the mixture is melted and completely surrounds each of the phosphor grains.

Next, the heat-treated mixture is broken into fragments by quenching the heat-treated mixture. For example, the heat-treated mixture can be subjected to quenching in such a fashion of immersing the platinum crucible into water having a low temperature of about 4 or 5° C. Then, the heat-treated mixture will be broken along the most fragile portions on a path of the glass in which the phosphor grains do not exist, whereby the phosphor grains distributed in the glass can be separated from one another. In other words, by quenching a mass formed of the mixture of the glass composition and the phosphor gains, the glass will be broken along the fragile portions on the path where the phosphor grains do not exist.

As a result, it is possible to obtain phosphors, each having a glass coating layer formed on the surface of the phosphor grain. Additionally, to make the surface of the glass coating layer smooth, a surface treatment process, for example, an additional heat treatment at temperatures of about 800~900° C., may be performed.

The conventional phosphor free of the glass coating layer undergoes deterioration of the chemical characteristics caused by reaction with moisture, and, when applied to a light emitting diode, the conventional phosphor undergoes a rapid deterioration in luminescence characteristics due to heat discharged from a light emitting diode chip of the diode. On the other hand, the phosphor formed by the method according to the invention to have the glass coating layer formed on the surface thereof can have improved reliability through improvement in moisture and heat stability. Specifically, the glass coating layer of the phosphor completely blocks infiltration of moisture into the phosphor grain, preventing the phosphor of the invention from being deteriorated in the chemical characteristics relating to the reaction with the moisture, and the low thermal conductivity of the glass coating layer ensures excellent thermal insulation effect, improving the stability at high temperatures.

Figure 3:
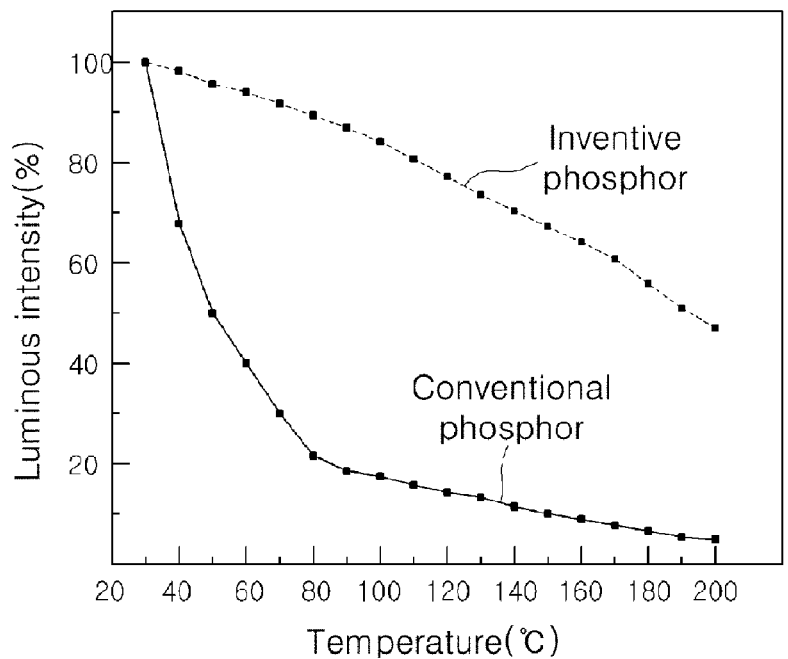
FIG. 3 is a graph depicting variation in luminous intensity of light emitting diodes, one of which is manufactured using a phosphor produced by the method according to the first embodiment of the invention, and, the other is manufactured using a conventional phosphor.

FIG. 3 is a graph depicting variation in luminous intensity of light emitting diodes, one of which is manufactured using a phosphor produced by the method according to the first embodiment of the invention, and, the other is manufactured using a conventional phosphor. For a light emitting diode having conventional YAG:Ce phosphors applied to a light emitting diode chip and for a light emitting diode comprising a light emitting diode chip, to which a silicon resin containing YAG:Ce phosphors with a glass coated on the surface of each phosphor gain is applied, variation of the luminous intensity in relation to a temperature increase was measured, and results are depicted in the graphs wherein the variation of the luminous intensity with respect to an initial value set to 100% is shown. The variation of the luminous intensity refers to loss of optical characteristics by the deterioration in the chemical characteristics of the phosphor resulting from the temperature increase. As can be appreciated from the drawing, the phosphor of this embodiment exhibits a very low variation in the luminous intensity as compared to the conventional phosphor. That is, for the phosphor of this embodiment, the excellent thermal insulation effect of the glass coated on the surface of the phosphor grain results in minimization of influence relating to the temperature increase, thereby preventing the deterioration of the optical characteristics.

As described above, the phosphor having the glass coating layer formed on the surface thereof ensure the chemical stability against moisture and heat as well as the luminescence characteristics of the phosphor, thereby achieving reliability of the phosphor.

Next, a second embodiment of the invention is described with reference to FIGS. 1, and 4 to 10.

Embodiment 2

In this embodiment, a phosphor grain 1 may comprise, for example, a sulfide-based phosphor that is likely to react with moisture irrespective of its excellent fluorescent characteristics, i.e., sulfide-based phosphors such as (Ca, Sr)S:Eu, (Ca, Sr, Ba)(Al, Ga, In)$_2$S$_4$:Eu, etc.

A glass coating layer 2 comprises a composite oxide of $SiO_2$, $Al_2O_3$ or $SiO_2$—$Al_2O_3$. In particular, when the glass coating layer 2 is comprised of the composite oxide of $SiO_2$—$Al_2O_3$, the phosphor exhibits further excellent moisture stability. Here, it is apparent to those skilled in the art that the composite oxide of $SiO_2$—$Al_2O_3$ satisfies Formula 1 of the first embodiment described above.

The phosphor comprises the glass coating layer 2 in an amount of about 0.1~15 wt % to a phosphor grain. Further, for the glass coating layer 2 comprised of the composite oxide of $SiO_2$—$Al_2O_3$, a mixing ratio of $SiO_2$ to $Al_2O_3$ is preferably in the range of about 95:5 to about 30:70 by weight, and more preferably about 90:10 to about 60:40 by weight.

Such a glass coating layer 2 surrounds the phosphor grain 1, and provides the chemically stable characteristics to the phosphor by blocking the reaction with moisture while maintaining the inherent characteristic of the phosphor.

Figure 4:
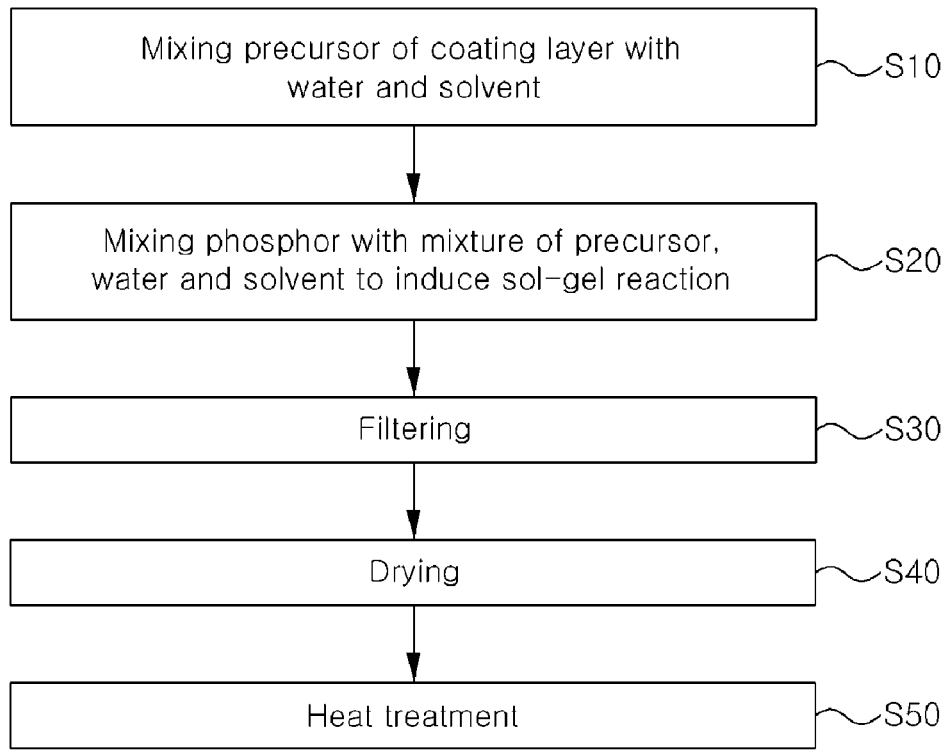
FIG. 4 is a flow chart illustrating a method for manufacturing a phosphor according to a second embodiment of the present invention.

FIG. 4 is a flow chart illustrating a method for manufacturing a phosphor according to the second embodiment of the invention.

Referring to FIG. 4, first, a precursor mixture comprising precursors of a glass coating layer, water, and a solvent is prepared (S10). Obviously, phosphor grains are prepared before the preparation of the precursor mixture. Then, the precursor mixture is mixed with the phosphor grains to induce a sol-gel reaction, followed by coating a glass formed through the sol-gel reaction on the surfaces of the phosphor grains (S20). Next, only the phosphor rains having the glass coating layer formed thereon are separated through filtering (S30), followed by drying the phosphor grains (S40) and heat-treating the phosphor grains (S50).

In manufacture of the phosphor according to this embodiment, a coating layer (i.e., glass coating layer) of the composite oxide of $SiO_2$, $Al_2O_3$ or $SiO_2$—$Al_2O_3$ is formed on the surface of each phosphor grain through the sol-gel reaction with an organometallic compound as a starting material.

First, precursors of the coating layer, water and a solvent are mixed to induce the sol-gel reaction (S10).

Here, the precursors may comprise tetraethyl orthosilicate (TEOS) or tetramethyl orthosilicate (TMOS) as an organometallic compound precursor for forming an $SiO_2$ coating layer, and aluminum acetylacetonate (Al—AcAc), aluminum tri-sec-butoxide (Al-tsBO) or aluminum iso-propoxide (Al-iPO) as an organometallic compound precursor for forming an $Al_2O_3$ coating layer.

As the precursor for the $SiO_2$ coating layer, TEOS or TMOS is preferably diluted with ethanol absolute for the purpose of correct measurement and adjustment of a rapid hydrolysis rate with moisture. At this time, TEOS or TMOS is preferably diluted to become about 0.1~5 wt %/cc based on the weight of the phosphor grains, which will be coated thereby.

For the same reason as described above, Al-tsBO or Al-iPO, the precursor of the $Al_2O_3$ coating layer, is also preferably diluted with ethanol/acetylacetone or acetylacetone. At this time, Al-tsBO or Al-iPO is preferably diluted to become about 0.01~1 wt %/cc based on the weight of the phosphor grains, which will be coated thereby. Additionally, Al-AcAc in the form of powders is also preferably diluted with ethanol/acetylacetone or acetylacetone to become about 0.01~1 wt %/cc based on the weight of the phosphor grains, which will he coated thereby.

Preferably, the diluted precursor of the $SiO_2$, coating layer is added in an amount of about 0.1~10 wt % to the phosphor grains, which will be coated thereby, and the diluted precursor of the $Al_2O_3$ coating layer is added in an amount of about 0.1~5 wt % to the phosphor grains, which will he coated thereby.

The sol-gel reaction is obtained by hydrolysis and polycondensation reactions of the precursors described above. For the sol-gel reaction, the precursors of the coating layers are mixed with water and a solvent. The solvent may be ethanol, and is preferably mixed with water in a ratio of about 5:95 to about 50:50 by volume.

For example, in the case where phosphor grains as a coating target are 3 g, the diluted organometallic compound precursors of the $SiO_2$ and $Al_2O_3$ coating layers as described above are added and uniformly mixed in respective ratios of about 0.1 to about 10 wt % and about 0.1 to about 5 wt % to the weight of the phosphor grains with a mixture of about 1~50 cc water and about 20~300 cc ethanol.

Specifically, after water and the solvent are first mixed, the diluted organometallic compound precursors of the $SiO_2$ and $Al_2O_3$ coating layers described above are added to the mixture of the solvent and water, followed by uniform stirring by means of a rotator to form a precursor mixture. Formation of the precursor mixture is not limited to this method and can be achieved in various manners. For example, the diluted organometallic compound precursors can be mixed with the solvent, followed by adding water thereto.

Next, the phosphor grains are mixed with a mixture of the precursors for the coating layer, water and solvent to induce the sol-gel reaction under a predetermined temperature (S20). For acceleration of the sol-gel reaction, a solution of the mixture can be heated at a temperature within ±20° C. from an evaporation temperature of the solvent, for example, at about 60~100° C. Further, heating is performed for a sufficient time, for example, for about 1~20 hours, such that the $SiO_2$, $Al_2O_3$ or $SiO_2$—$Al_2O_3$ coating layer formed by the sol-gel reaction can completely surround each of the phosphor grains.

Then, the solution formed by the sol-gel reaction is filtered to separate only the phosphor grains (S30). Here, the $SiO_2$, $Al_2O_3$ or $SiO_2$—$Al_2O_3$ coating layer synthesized through the sol-gel reaction is formed on the surfaces of the phosphor grains.

Next, the separated phosphor grains are dried to completely remove the remaining solvent (S40). Drying can be performed, for example, at about 60 to about 150° C. for about 1~2 hours.

The dried phosphor grains are heat-treated at a relatively high temperature (S50). This heat-treatment enables the $SiO_2$, $Al_2O_3$ or $SiO_2$—$Al_2O_3$ coating layer to be stably coupled to each of the phosphor grains. The heat--treatment can be performed at about 200~600° C. for about 1~24 hours under ambient atmosphere.

With this method, phosphors comprising the phosphor grains, each of which has the $SiO_2$, $Al_2O_3$ or $SiO_2$—$Al_2O_3$ coating layer formed on the surface thereof, can be produced.

Here, it should be understood that various modifications and changes can be made to the detailed processes of the method for desired characteristics and process conveniences without being limited to the aforementioned detailed processes. For example, a surface treatment process, for example, an additional heat-treatment, can be performed to form a smooth surface of the coating layer, which surrounds each of the phosphor grains.

As described above, the conventional phosphor suffers from deterioration of the chemical characteristics caused by reaction with moisture, and, when applied to a light emitting diode, the light emitting diode suffers from a rapid deterioration in light emitting characteristic due to heat from a light emitting diode chip. Particularly, the sulfide-based phosphors, such as (Ca, Sr)S:Eu, (Ca, Sr, Ba)(Al, Ga, In)$_2S_4$:Eu, etc., are likely to react with the moisture and cause variation of the chemical characteristics, Further, $H_2S$ gas generated by a chemical reaction between the sulfide-based phosphor and the moisture changes the fluorescent characteristics of the phosphor to cause a rapid reduction of luminous intensity along with variation of the chromaticity coordinate.

On the other hand, with the method of the present invention as described above, the phosphor comprises the phosphor grains, each of which has the $SiO_2$, $Al_2O_3$ or $SiO_2$—$Al_2O_3$ coating layer formed on the surface thereof, thereby improving the moisture stability. In other words, since the coating layers of the phosphor blocks the reaction between the phosphor grains and the moisture, the phosphor can be prevented from being deteriorated in the chemical characteristics and have improved luminous characteristic.

Figure 5:
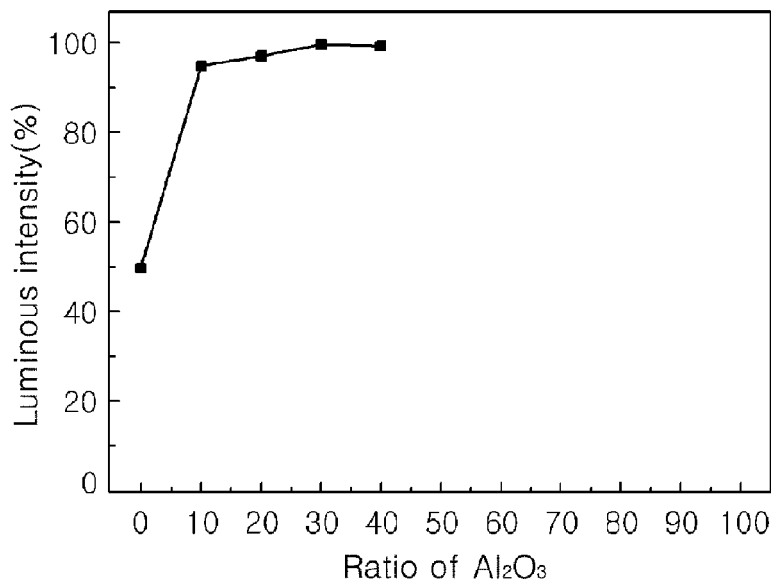
FIG. 5 is a graph depicting a result of a reliability test according to a composition of a coating layer of the phosphor produced by the method according to the second embodiment.

FIG. 5 is a graph depicting a result of a reliability test according to a composition of a coating layer surrounding a (Ca, Sr)S:Eu phosphor grain according to this embodiment. In FIG. 5, the test was performed with an increment in ratio of $Al_2O_3$ in formation of an about 3 wt % $SiO_2$—$Al_2O_3$ composite oxide coating layer to the phosphor grain. Here, the variation of the luminous intensity refers to loss of the optical characteristics resulting from deterioration in the chemical characteristics of the phosphor by reaction with moisture. As can be seen from FIG. 5, as the ratio of $Al_2O_3$ in the glass coating layer is increased from about 0% to about 5%, the luminous intensity increases in an approximately linear form. On the other hand, as the ratio of $Al_2O_3$ in the glass coating layer is increased from about 5% to about 40%, there is little change in the luminous intensity. Therefore, it is desirable that the composite oxide coating layer (that is, glass coating layer) of $SiO_2$, $Al_2O_3$ or $SiO_2$—$Al_2O_3$ be formed on the surface of the phosphor grain, and the ratio of $Al_2O_3$, be about 5~40% of the overall coating layer.

Figure 6:
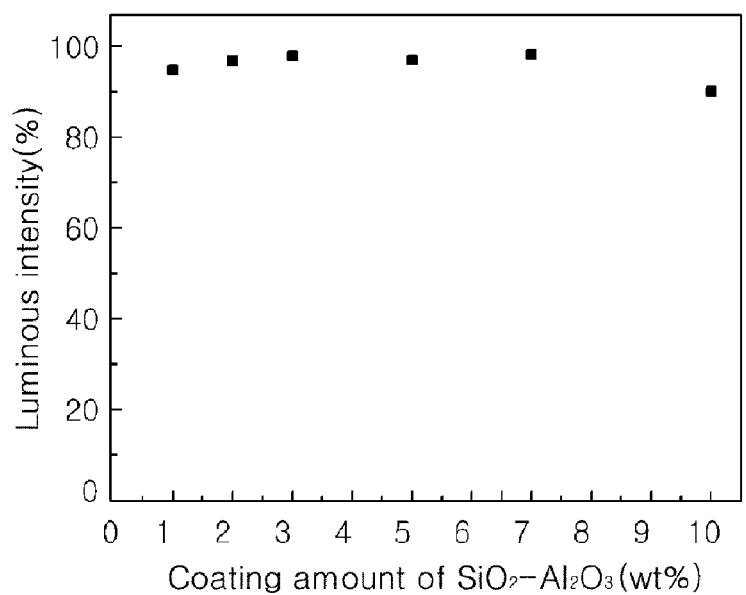
FIG. 6 is a graph depicting a result of a reliability test according to an amount of the coating layer of the phosphor produced by the method according to the second embodiment.

FIG. 6 is a graph depicting a result of a reliability test according to an amount of the coating layer surrounding a (Ca, Sr)S:Eu phosphor grain. In FIG. 6, the test was performed with an increment in an amount of the coating layer with respect to the phosphor grain from about 1 wt % to about 10 wt % in formation of the $SiO_2$—$Al_2O_3$ composite oxide coating layer in a ratio of about 65:35 on the surface of the phosphor grain. As can be seen from the graph, when the $SiO_2$—$Al_2O_3$ composite oxide coating layer is formed in an amount of about 1~about 10 wt % on the surface of the phosphor grain, there is little change in the luminous intensity of the phosphor.

Figure 7:
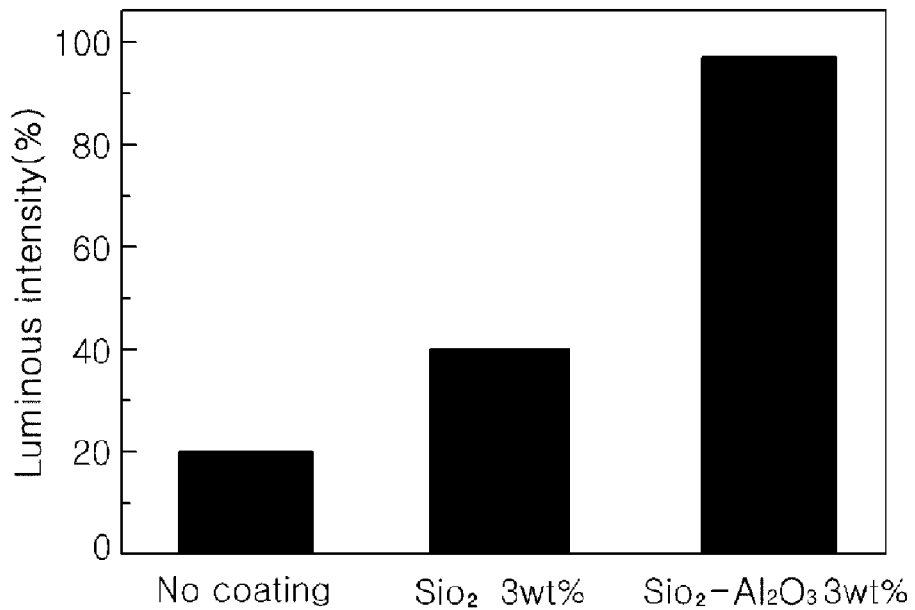
FIGS. 7 to 10 are comparative graphs depicting a result of a moisture stability test of the phosphor produced by the method of the second embodiment.
Figure 8:
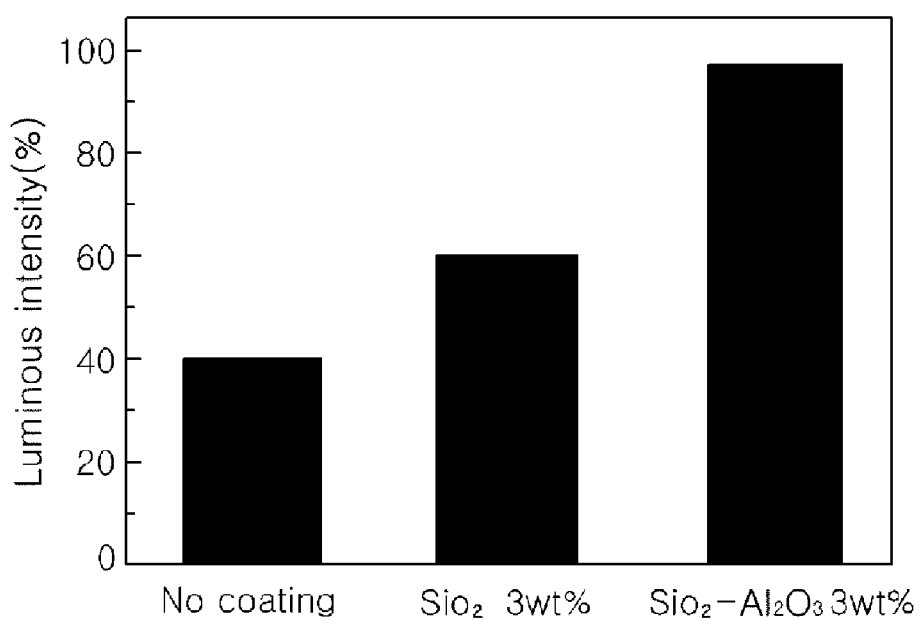

FIGS. 7 and 8 are comparative graphs depicting luminous characteristic of phosphors exposed to hot steam of about 100° C. for about 10 hours according to compositions of coating layers surrounding a (Ca, Sr)S:Eu phosphor grain and a. (Ca, Sr, Ba)(Al, Ga, In)$_2S_4$:Eu phosphor grain, respectively. Specifically, after exposing a phosphor free of the coating layer, a phosphor with the about 3 wt % $SiO_2$ coating layer formed on the surface thereof, and a phosphor with the $SiO_2$—$Al_2O_3$ composite oxide coating layer formed in a ratio of about 65:35 on the surface thereof to hot steam of about 100° C. for about 10 hours, variation of the luminous intensity was measured. A result of measurement is shown in the graphs where an initial value is set to 100% for comparison.

Referring to FIG. 7 showing the graph relating to the (Ca, Sr)S:Eu phosphor grain, it can be seen that, when exciting light of about 460 nm, the phosphor free of the coating layer exhibits a remarkable change in an appearance of the phosphor compared to an initial state and has a luminous intensity of about 20% of the initial value due to loss of the optical characteristics by the reaction with moisture, Further, as can be seen from the graph, the phosphor with the $SiO_2$ coating layer formed on the surface thereof has a luminous intensity about 50% of the initial value, and, the phosphor with the $SiO_2$—$Al_2O_3$ composite oxide coating layer formed on the surface thereof has a luminous intensity about 98% or more of the initial value.

Referring to FIG. 8 showing the graph relating to the (Ca, Sr, Ba)(Al, Ga, In)$_2S_4$:Eu phosphor grain, it can be seen that, when exciting light of about 460 nm, the phosphor free of the coating layer exhibits a remarkable change in an appearance of the phosphor compared to an initial state and has a luminous intensity about 40% of the initial value due to loss of the optical characteristics by the reaction with moisture. Further, as can be seen from the graph, the phosphor with the $SiO_2$ coating layer formed on the surface thereof has a luminous intensity about 70% of the initial value, and, the phosphor with the $SiO_2$—$Al_2O_3$ composite oxide coating layer formed on the surface thereof has a luminous intensity about 95% or more of the initial value.

As can be seen from FIGS. 7 and 8, the phosphors having the coating layers formed on the surface thereof according to the present invention exhibit a lower variation in luminous intensity compared to the phosphor free of the coating layer. That is, it can he seen from the graphs that the coating layer on the surface of the phosphor grain blocks the reaction with moisture and prevents deterioration of the optical characteristics. In particular, for the phosphor having the $SiO_2$—$Al_2O_3$ composite oxide coating layer on the surface thereof, there is substantially no variation of the luminous intensity, whereas the moisture stability is remarkably improved.

Figure 9:
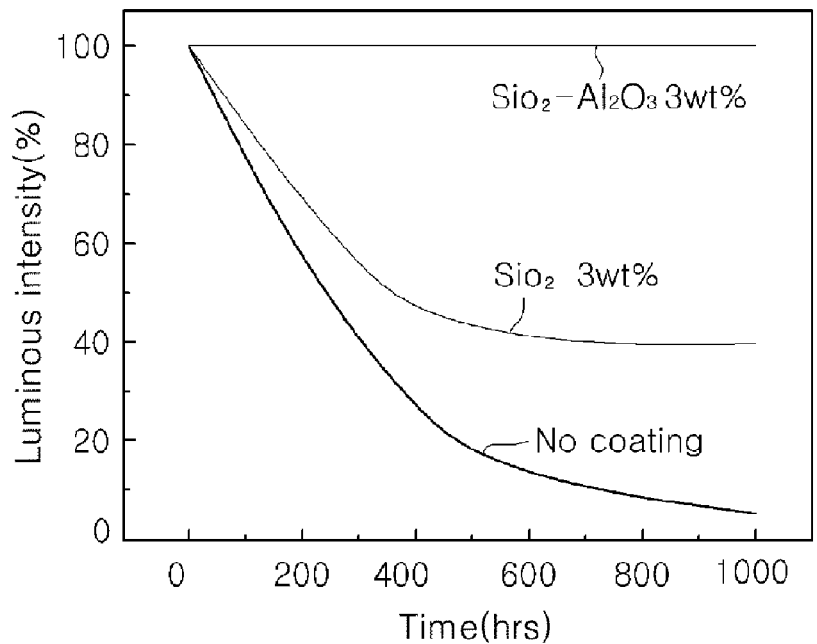
Figure 10:
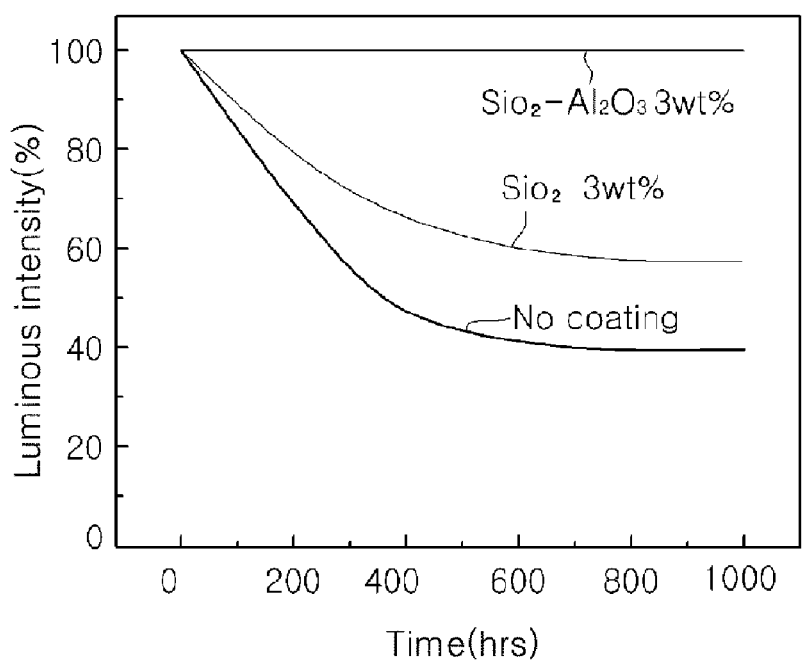

FIGS. 9 and 10 are comparative graphs depicting variation of luminous intensity of light emitting diodes which are manufactured using the (Ca, Sr)S:Eu phosphor and the (Ca, Sr, Ba)(Al, Ga, In)$_2$S$_4$:Eu phosphor, respectively. After preparing a phosphor free of the coating layer, a phosphor with an about 3 wt % SiO$_2$ coating layer formed on the surface thereof, and a phosphor with a SiO$_2$—Al$_2$O$_3$ composite oxide coating layer formed in a ratio of about 65:35 on the surface thereof, each of the phosphors was mixed in the same amount with a transparent resin, injected into a package, and cured to manufacture a light emitting diode, which was then maintained at about 85° C. in an atmosphere of an about 85% relative humidity for about 1,000 hours. The variation of the luminous intensity depending on a time was measured. A result of the measurement is shown in the graphs where an initial value is set to 100% for comparison. FIG. 9 is the graph relating to the (Ca, Sr)S:Eu phosphor and FIG. 10 is the graph relating to the (Ca, Sr, Ba)(Al, Ga, In)$_2$S$_4$:Eu phosphor.

As can be seen from FIGS. 9 and 10, the light emitting diode employing the phosphors having the coating layers of the aforementioned composite oxide on the surfaces of the phosphor grains exhibit a lower variation in luminous intensity compared to the phosphor free of the coating layer. That is, it can be seen from the graphs that the coating layer on the surface of the phosphor grain blocks the reaction with moisture and prevents deterioration of the optical characteristics. Particularly, for the light emitting diode employing the phosphor having the SiO$_2$—Al$_2$O$_3$ composite oxide coating layer on the surface thereof, there was a remarkable improvement of the moisture stability, which improves reliability of the phosphor.

In this manner, with the SiO$_2$—Al$_2$O$_3$ composite oxide coating layer formed on the surface of the phosphor grains, the phosphor can ensure the chemical stability against moisture along with improved luminous characteristic, which improves the reliability of the phosphor.

Next, embodiments of a light emitting diode comprising the phosphor as described above are described with reference to FIGS. 11 and 12.

Embodiment 3: Chip-Type Light Emitting Diode

Figure 11:
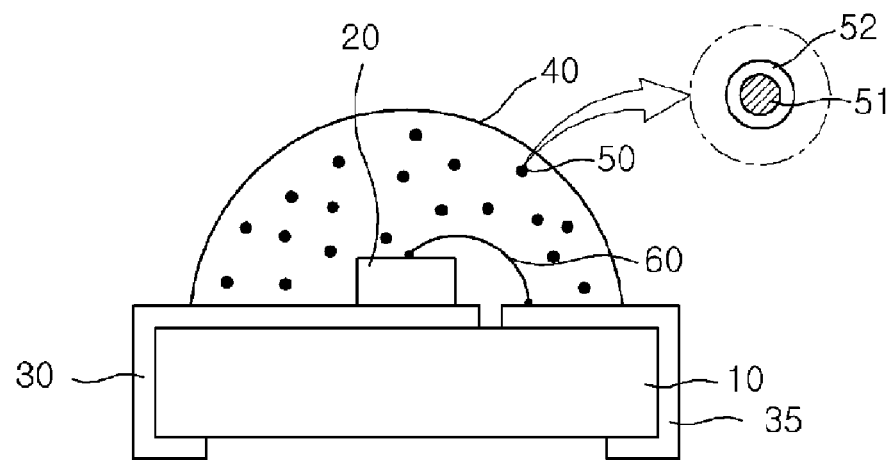
FIG. 11 is a cross-sectional view of a chip-type light emitting diode manufactured using the phosphor according to the present invention.

FIG. 11 is a cross-sectional view of a chip-type light emitting diode manufactured using a phosphor according to the invention. Referring to FIG. 11, the light emitting diode comprises a substrate 10, first and second electrodes 30 and 35 formed on the substrate 10, a light emitting diode chip 20 mounted on the first electrode 30, and a molding part 40 to envelope the light emitting diode chip 20. Phosphors 50, each of which has a coating layer 52 formed on the surface of a phosphor grain 51 as described above, are uniformly distributed in the molding part 40.

A recess having an inclined sidewall is formed on a central region of the substrate 10 where the light emitting diode chip 20 will be mounted. Here, with the light emitting diode chip 20 mounted on the bottom of the recess, the inclined sidewall of the recess enables maximization of reflection of light emitted from the light emitting diode chip 20, improving light emitting efficiency thereof Further, the substrate 10 may further comprise a heat sink to dissipate heat from the light emitting diode chip 20 to an outside. For example, after inserting the heat sink into a through-hole, which can be formed by removing a predetermined region on the substrate 10 where the light emitting diode chip 20 will he mounted, the light emitting diode chip 20 can be mounted above the heat sink. The heat sink is preferably formed. of a material having a high thermal conductivity, and more preferably, a material having high thermal and electric conductivity.

The first and second electrodes 30 and 35 can he formed by a printing method. The first and second electrodes 30 and 35 are formed of a metallic material comprising copper or aluminum having a good conductivity and are electrically blocked from each other.

The light emitting diode chip 20 is an ultraviolet (UV) light emitting diode chip. However, the present invention is not limited to this, and the light emitting diode chip 20 may be a GaN, InGaN, AlGaN or AlGaInN-based blue light emitting diode chip. Additionally, the number of light emitting diode chips 20 may be one or plural according to applications.

The light emitting diode chip 20 is mounted on the first electrode 30 and electrically connected to the second electrode 35 via a wire 60. In the case where the light emitting diode chip 20 is not mounted on the first or second electrode 30 or 35 but directly on the substrate 10, the light emitting diode chip 20 can be connected to the first electrode 30 and the second electrode 35 via two wires 60, respectively.

Further, the molding part 40 is formed on the substrate 10 to envelope the light emitting diode chip 20. The molding part 40 has the phosphors 50 of the invention uniformly mixed and distributed therein. The molding part 40 maybe formed of a mixture of a certain transparent epoxy resin and the phosphors 50 by injection molding. Alternatively, after a preform of the molding part is prepared using a separate mold, the preform is compressed or heat-treated to form the molding part 40. The molding part 40 can be formed in various shapes including an optical lens shape, a planar shape. a roughness shape, etc.

Embodiment 4: Lamp-Type Light Emitting Diode

Figure 12:
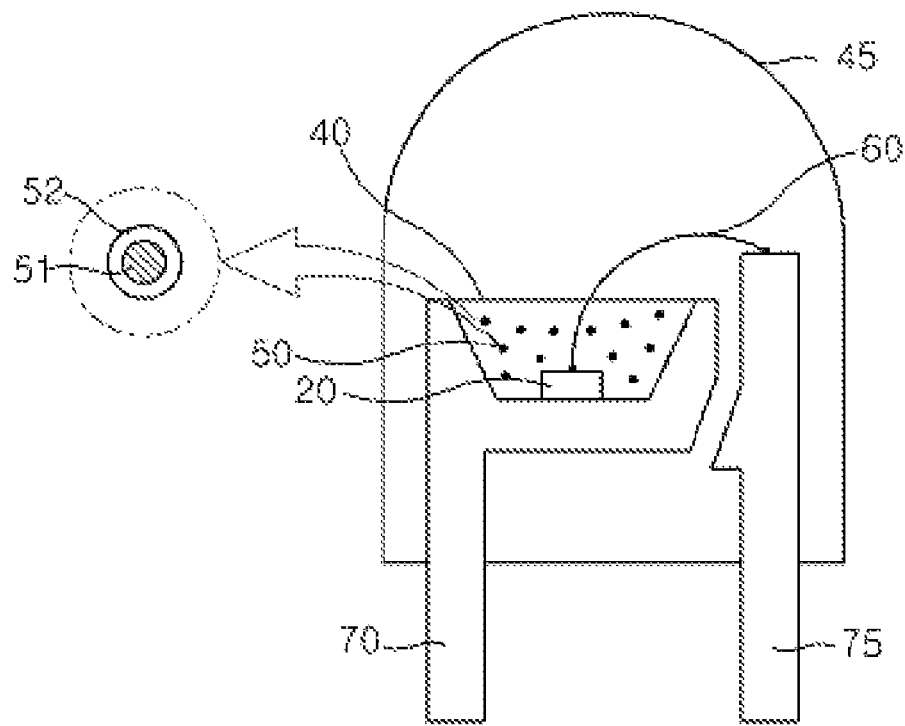
FIG. 12 is a cross-sectional "view of a lamp-type light emitting diode manufactured using the phosphor according to the present invention.

FIG. 12 is a cross-sectional view of a lamp-type light emitting diode manufactured using a phosphor according to the invention. Referring to FIG. 12, the light emitting diode comprises a first lead terminal 70 having a reflection part formed thereon, and a second lead terminal 75 spaced a predetermined distance from the first lead terminal 70. A light emitting diode chip 20 is mounted inside the reflection part of the first lead terminal 70 and electrically connected to the second lead terminal 75 via a wire 60. The light emitting diode further comprises a molding part 40 formed on the light emitting diode chip 20 and comprising phosphors 50, each of which has a coating layer 53 on the surface of a phosphor grain 51, and an outer molding part 45 formed on leading ends of the lead terminals 70 and 75 using a template for molding. In the molding part 40, the phosphors 50 of the invention for absorbing light emitted from the light emitting diode chip 20 and converting a frequency of the light are uniformly distributed. The outer molding part 45 is formed of a transparent epoxy or silicon resin to improve the transmittance of light emitted from the light emitting diode chip 20.

The subject matter of the present invention is not limited to the aforementioned embodiments and can be applied to products having various configurations through various modifications and changes.

The light emitting diodes described above realize colors in a desired spectrum region in such a fashion as to emit primary light from the light emitting diode chip, to emit secondary light from the phosphors with the secondary light converted in frequency by the primary light, and to combine the first and second light.

For example, a light emitting diode can realize white light emission through combination of colors using a blue light emitting diode, and phosphors for green luminescence and red luminescence. As the phosphor for the green luminescence, the orthosilicate phosphor or the thiogallate phosphor expressed by (Ca. Sr. Ba)(Al, Ga, In)$_2$S$_4$:Eu may be employed. Further, as the phosphor for the red luminescence, the sulfide-based phosphor, such as (Ca, Sr)S:Eu, (Zn, Cd)(S, Se):Ag, etc., or the nitride-based phosphor may be employed.

With the phosphor having the $SiO_2$—$Al_2O_3$ composite oxide coating layer on the surface thereof, the light emitting diode of the invention exhibits excellent moisture stability, as compared to the conventional light emitting diode, thereby ensuring an extended lifetime of the phosphor while improving the light emitting efficiency and reliability of the light emitting diode. In particular, for the sulfide-based phosphor likely to react with moisture, the coating layer formed on the phosphor grain block the reaction with the moisture, improving the moisture stability and the optical characteristics.

As apparent from the above description, the phosphor of the invention has a glass coating layer on the surface of the phosphor grain to prevent infiltration of moisture into the phosphor grain, improving stability in terms of luminous intensity and optical characteristics with respect to heat discharged from a light emitting diode chip. With such improved moisture and heat stability, the phosphor ensures good reliability and luminous characteristic.

Further, according to the present invention, a white light emitting diode having improved reliability and light emitting efficiency can be manufactured using the phosphor, which has good characteristics even at high temperature and high humidity, and can be used as a good light source for general illumination and LCD backlight units.

Although the present invention has been described with reference to the exemplary embodiments and the accompanying drawings, it is not limited to the embodiments and the drawings. It should be understood that various modifications and changes can be made by those skilled in the art without departing from the spirit and scope of the present invention defined by the accompanying claims.

What is claimed is:

1. A phosphor comprising:
   a phosphor grain excitable by light, wherein the phosphor grain has a glass coating layer formed on a surface thereof,
   wherein the glass coating layer is formed in an amount of about 0.1 to about 15 wt % of the phosphor grain.

2. The phosphor according to claim 1, wherein the glass coating layer comprises a glass composition expressed by the following formula:

$a(M'_2)O\text{-}b(M''O)\text{-}c(M'''_2O_3)\text{-}d(M''''O_2)\text{-}e(M'''''_2O_5)$ where M' is one element selected from the group consisting of Li, Na and K, M" is at least one element selected from the group consisting of Mg, Ca, Sr, Ba, Cu, Zn, Pb and Be, M''' is at least one element selected from the group consisting of B, Al, Ga, In, Fe, Y, La, Sc and Bi, M'''' is at least one element selected from the group consisting of Si, Ti and Ge, M''''' is at least one element selected from the group consisting of P, Ta and V, and a, b, c, d and e are set in the ranges of $0 \leq a \leq 0.6$, $0 \leq b \leq 0.6$, $0 < c \leq 0.6$, $0 < d \leq 0.95$, and $0 \leq e \leq 0\,0.2$.

3. The phosphor according to claim 1, wherein the glass coating layer comprises $SiO_2$—$Al_2O_3$.

4. The phosphor according to claim 3,
   wherein a ratio of $SiO_2$ to $Al_2O_3$ in the glass coating layer is in a range of about 90:10 to about 60:40 by weight.

5. The phosphor according to claim 3, wherein the phosphor is a sulfide-based phosphor.

6. A phosphor comprising:
   a phosphor grain excitable by light, wherein the phosphor grain has a glass coating layer formed on a surface of the phosphor grain directly,
   wherein the glass coating layer comprises Pb.

7. The phosphor according to claim 6, wherein the glass coating layer comprises a glass composition expressed by the following formula:

$a(M'_2)O\text{-}b(M''O)\text{-}c(M'''_2O_3)\text{-}d(M''''O_2)\text{-}e(M'''''_2O_5)$ where M' is one element selected from the group consisting of Li, Na and K, M" is at least one element selected from the group consisting of Mg, Ca, Sr, Ba, Cu, Zn, Pb and Be, M''' is at least one element selected from the group consisting of B, Al, Ga, In, Fe, Y, La, Sc and Bi, M'''' is at least one element selected from the group consisting of Si, Ti and Ge, M''''' is at least one element selected from the group consisting of P, Ta and V, and a, b, c, d and e are set in the ranges of $0 \leq a \leq 0.6$, $0 < b \leq 0.6$, $0 < c \leq 0.6$, $0 < d \leq 0.95$, and $0 \leq e \leq 0.2$.

8. The phosphor according to claim 6, wherein the glass coating layer is formed in an amount of about 0.1 to about 15 wt % of the phosphor grain.

9. A phosphor comprising:
   a phosphor grain excitable by light, wherein the phosphor grain has a glass coating layer formed on a surface thereof,
   wherein the glass coating layer comprises $SiO_2$—$Al_2O_3$, and
   wherein a ratio of $SiO_2$ to $Al_2O_3$ in the glass coating layer is in a range of about 90:10 to about 60:40 by weight.

* * * * *